(12) United States Patent
Hayashi

(10) Patent No.: US 10,519,543 B2
(45) Date of Patent: Dec. 31, 2019

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventor: Akinari Hayashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/133,759

(22) Filed: Sep. 18, 2018

(65) Prior Publication Data

US 2019/0093219 A1  Mar. 28, 2019

(30) Foreign Application Priority Data

Sep. 26, 2017  (JP) ................ 2017-184280

(51) Int. Cl.
*C23C 16/44* (2006.01)
*H01L 21/677* (2006.01)
*H01L 21/673* (2006.01)
*H01L 21/67* (2006.01)
*H01L 21/02* (2006.01)

(52) U.S. Cl.
CPC .... *C23C 16/4408* (2013.01); *H01L 21/67017* (2013.01); *H01L 21/6732* (2013.01); *H01L 21/67196* (2013.01); *H01L 21/67742* (2013.01); *H01L 21/67757* (2013.01); *H01L 21/67778* (2013.01); *H01L 21/67781* (2013.01); *H01L 21/0217* (2013.01); *H01L 21/02532* (2013.01); *H01L 21/02595* (2013.01)

(58) Field of Classification Search
CPC combination set(s) only.
See application file for complete search history.

(56) References Cited

U.S. PATENT DOCUMENTS

| 8,443,484 B2 | 5/2013 | Ozaki et al. |
| 9,548,229 B2 | 1/2017 | Yachi |
| 2012/0083120 A1 | 4/2012 | Nakada et al. |
| 2013/0095668 A1* | 4/2013 | Saito ................. C23C 16/45534 438/758 |

(Continued)

FOREIGN PATENT DOCUMENTS

| JP | 2003-007802 A | 1/2003 |
| JP | 2007-095879 A | 4/2007 |
| JP | 2009-065113 A | 3/2009 |

*Primary Examiner* — Ratisha Mehta
(74) *Attorney, Agent, or Firm* — Volpe and Koenig, P.C.

(57) ABSTRACT

There is provided a technique that includes: a reaction chamber that processes a substrate on a substrate support; a transfer chamber; a gate that opens and closes an opening and is formed in the transfer chamber; a transfer device; a clean unit supplying a clean atmosphere to the transfer chamber; an inert gas supplier supplying an inert gas to the transfer chamber; and a controller controlling the inert gas supplier such that, after the loading of the substrate from a substrate container to the substrate support by the transfer device is completed and the gate is closed, the inert gas supplier supplies the inert gas during a time period until the gate is opened again and does not supply the inert gas in another time period, and control the transfer chamber to be kept at a positive pressure by an air atmosphere.

18 Claims, 15 Drawing Sheets

(56) References Cited

U.S. PATENT DOCUMENTS

2016/0002789 A1* 1/2016 Kontani ............... C23C 16/448
438/778
2017/0292188 A1 10/2017 Nakada et al.

* cited by examiner

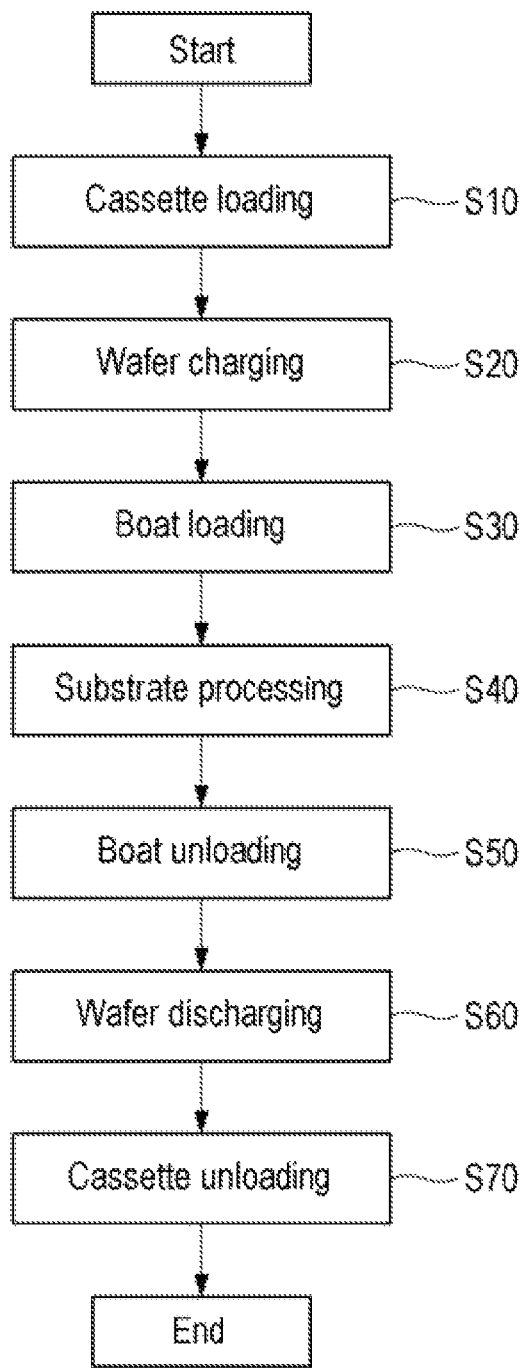

| Mode | | Operation mode | L/A pressure criteria | Air intake 501 | Exhaust damper 502 | Rear exhaust damper 503 | Circulation damper 506 | Local exhaust 508 509 | Rear fan 50b | Side fan 511 |
|---|---|---|---|---|---|---|---|---|---|---|
| Air atmosphere | | CHG/DCHG PROCESS | 10-20Pa | Open | Open | Open | Open | ON | ON | ON |
| | | DOOR OPEN | 0Pa | Open | Open | Open | Close | OFF | OFF | ON (MAX) |
| N₂ purge | | CHG/DCHG PROCESS | 55Pa (400L) | Close | Close | Close | Open | ON | OFF | ON |
| | | Standby BUNLOAD | Positive pressure | Open | Open | Close | Close | OFF | OFF | ON |
| | | Atmosphere return | — | Open | Open | Close | Open | ON | OFF | ON |

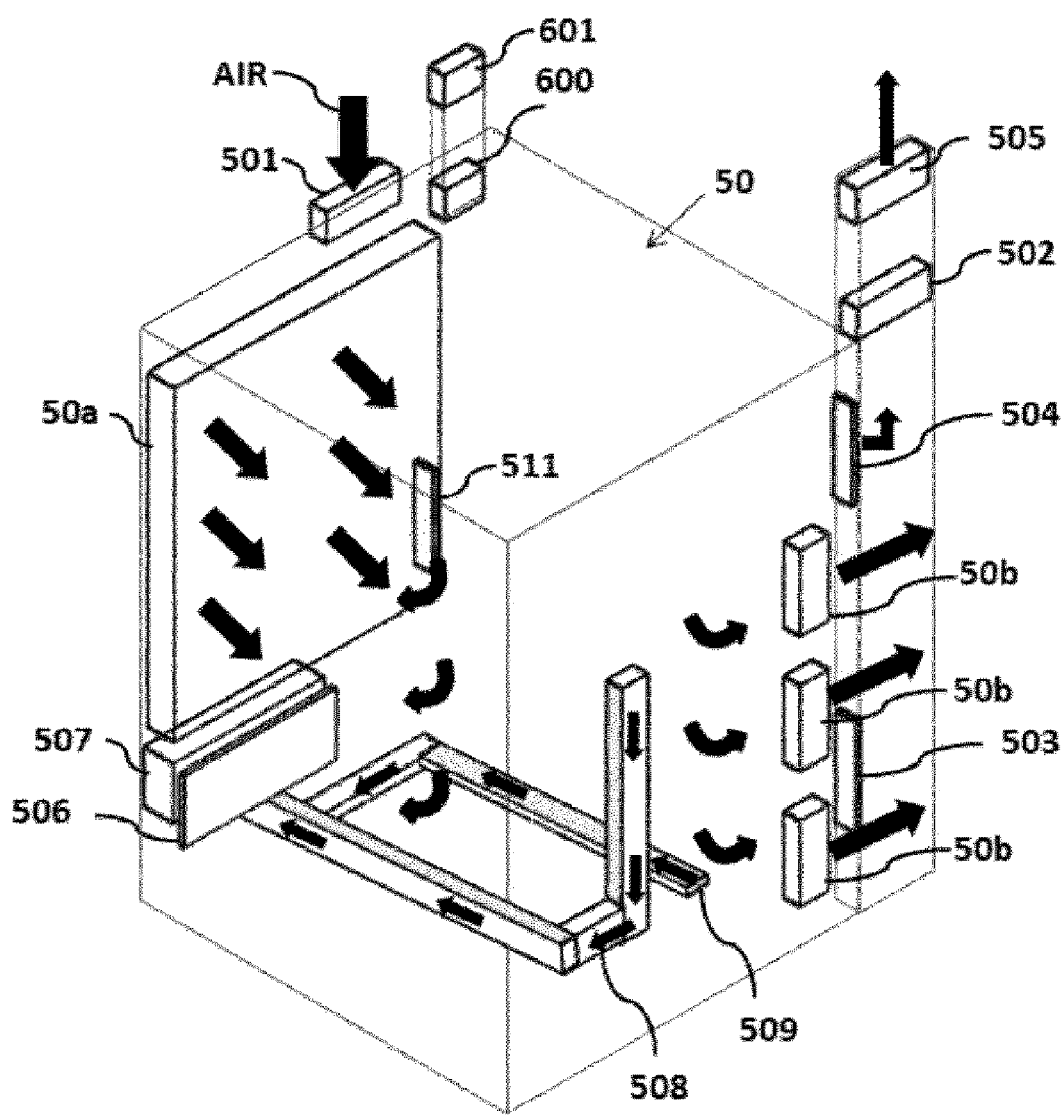

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2017-184280, filed on Sep. 26, 2017, the entire contents of which are incorporated herein by reference.

TECHNICAL FIELD

The present disclosure relates to a substrate processing apparatus, a method of manufacturing a semiconductor device, and a recording medium.

BACKGROUND

A transfer chamber for transferring substrates (wafers) stored in a cassette to a substrate support (boat) is installed in a substrate processing apparatus. The transfer chamber is purged with, for example, an inert gas such as a nitrogen gas, to suppress a natural oxide film from being formed on the wafers.

In the related art, there is a technique of purging a transfer chamber of a substrate processing apparatus with an inert gas.

When purging the transfer chamber with the inert gas such as the nitrogen gas, there is a need to reduce consumption of the nitrogen gas.

SUMMARY

The present disclosure provides some embodiments of a technique capable of reducing consumption of an inert gas such as a nitrogen gas for purging a transfer chamber of a substrate processing apparatus.

Other problems and novel features will become apparent in view of the description of the present disclosure and the accompanying drawings.

A summary of representative of the present disclosure will be briefly described as follows.

According to one embodiment of the present disclosure, there is provided a technique that includes: a reaction chamber configured to process a substrate in a state on a substrate support; a transfer chamber connected to the reaction chamber and in which the substrate support unloaded from the reaction chamber is disposed; a gate configured to open and close an opening and installed in the transfer chamber to move the substrate inside and outside the transfer chamber; a buffer shelf installed outside the transfer chamber to face the opening and to support a substrate container; a transfer device configured to transfer the substrate between the substrate container of the buffer shelf and the substrate support; a clean unit configured to supply a clean atmosphere to the transfer chamber; and an inert gas supplier configured to supply an inert gas to the transfer chamber, wherein, after the loading of the substrate from the substrate container to the substrate support by the transfer device is completed and the gate is closed, the inert gas supplier supplies the inert gas during at least a portion of a time period until the gate is opened again and does not supply the inert gas outside the portion of the time period so as to unload the processed substrate from the substrate support to the substrate container, and wherein the clean unit is configured to switch between a first mode and a second mode such that the transfer chamber is kept at a positive pressure by an air atmosphere and air flows out of the transfer chamber while the gate is opened, wherein, in the first mode, the clean unit intakes and cleans an internal atmosphere of the transfer chamber, and supplies the internal atmosphere thus cleaned to the transfer chamber, and wherein, in the second mode, the clean unit cleans air introduced from an outside of the apparatus and supplies the air thus cleaned to the transfer chamber, and discharges a surplus air to the outside of the apparatus.

BRIEF DESCRIPTION OF DRAWINGS

FIG. 5 is a diagram illustrating a process flow illustrating a method of processing a substrate according to an embodiment of the present disclosure.

FIG. 11 is a diagram illustrating a control of atmosphere in the transfer chamber.

FIG. 12 is a view conceptually illustrating a flow of atmosphere in the transfer chamber in a circulation mode of an air atmosphere.

DETAILED DESCRIPTION

Figure 1:
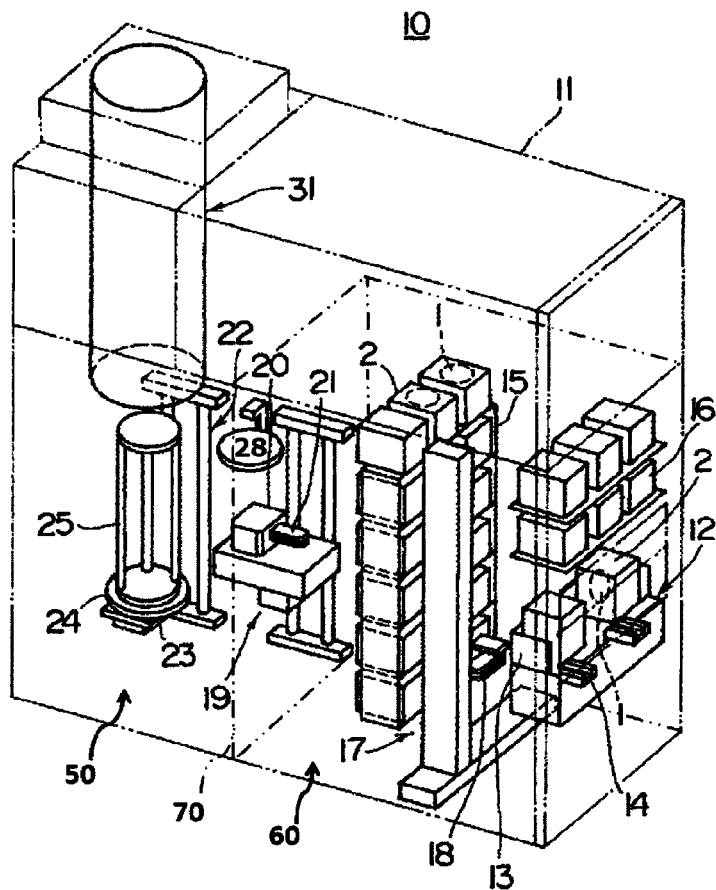
FIG. 1 is a view illustrating a substrate processing apparatus according to an embodiment of the present disclosure.

One embodiment of the present disclosure will now be described in detail with reference to the drawings. In the following description, however, like components are given like reference numerals and a repeated description thereof may be omitted. Further, in order to make the description clearer, the drawings may be schematically represented in terms of the width, thickness, feature or the like of each part, relative to the actual aspects, but it is merely an example and is not intended to limit the interpretation of the present disclosure.

Embodiments (1) Substrate Processing Apparatus A substrate processing apparatus according to an embodiment of the present disclosure will now be described with reference to the drawings. In the present embodiment, the substrate processing apparatus (hereinafter, also referred to simply as a processing apparatus) is configured as a semiconductor manufacturing apparatus that performs processing steps in a method of manufacturing a semiconductor device, as an example. In the following embodiments, a case where a batch-type vertical heat treatment apparatus that performs a film forming process such as CVD on a substrate is applied as the substrate processing apparatus will be described.

Hereinafter, a configuration of the processing apparatus will be described with reference to FIGS. 1, 2, and 3.

Figure 2:
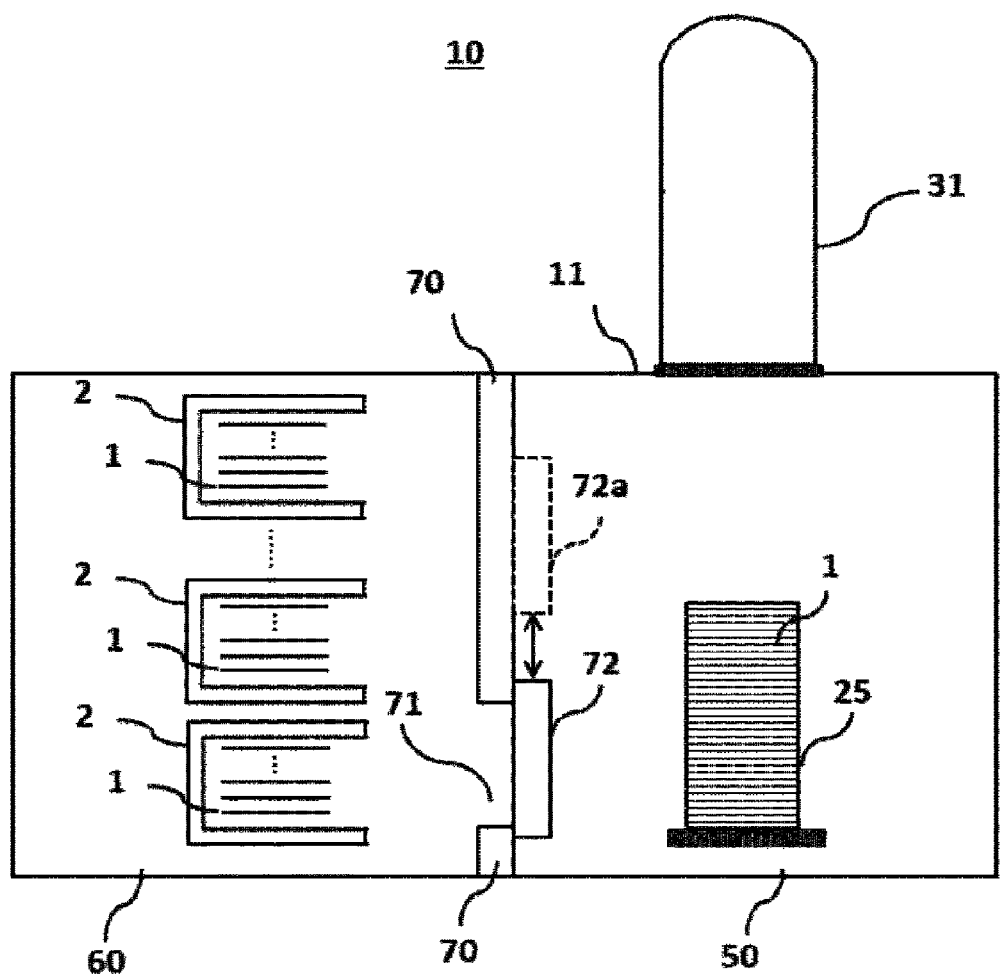
FIG. 2 is a view illustrating a configuration between a transfer chamber and a cassette holding chamber of the substrate processing apparatus according to an embodiment of the present disclosure.

As illustrated in FIG. 1, the processing apparatus 10 according to an embodiment of the present disclosure includes a housing 11, in which a cassette transfer unit 12 is installed on a front surface of the housing 11. The cassette transfer unit 12 includes a cassette stage 13 on which two substrate containers 2 (open cassettes, hereinafter referred to as cassettes) can be held on carriers of wafers 1. Two sets of wafer posture matching devices 14 are installed under the cassette stage 13. The substrate containers are not limited to the open cassettes and a standard mechanical interface (SMIF) or a front open unified pod (FOUP) may also be used.

When the cassettes 2 transferred by an external transfer device (not shown) are held on the cassette stage 13 in a vertical posture (a state where the wafers 1 stored in the cassettes 2 are vertical), the wafer posture matching devices 14 match the postures of the wafers 1 so that notches or orientation flats of the wafers 1 stored in the cassettes 2 match each other. The cassette stage 13 rotates by 90 degrees so that the cassettes 2 become in a horizontal posture. A cassette shelf 15 is installed inside the housing 11 so as to face the cassette transfer unit 12, and a spare cassette shelf 16 is installed above the cassette transfer unit 12.

A cassette transfer device 17 is installed between the cassette transfer unit 12 and the cassette shelf 15. The cassette transfer device 17 has a robot arm 18 that can advance and retreat in the longitudinal direction, in which the robot arm 18 is configured to be traversed and elevated. The robot arm 18 is configured to transfer the cassettes 2 in the horizontal posture on the cassette stage 13 to the cassette shelf 15 or the spare cassette shelf 16 so as to be held by advance and retreat (front and rear), up-down and transverse movements. The cassette shelf 15 and the spare cassette shelf 16 may also be regarded as buffer shelves of a plurality of cassettes 2.

A wafer transfer device 19 capable of transferring a plurality of wafers 1 in the cassettes 2 to a substrate support 25 (hereinafter, referred to as a boat) at a time or one by one is installed in the rear of the cassette shelf 15 so as to be rotatable and elevatable. The wafer transfer device 19 has a wafer support part 20 that can advance and retreat, and a plurality of wafer retaining plates 21 are horizontally installed in the wafer support part 20. A boat elevator 22 is installed in the rear of the wafer transfer device 19, and a seal cap 24 for rotatably supporting the boat 25 is horizontally installed on an arm 23 of the boat elevator 22.

(1-2) Cassette Holding Chamber and Transfer Chamber

As illustrated in FIG. 1, the processing apparatus 10 has a transfer chamber 50 and a cassette holding chamber 60. The wafer transfer device 19, the wafer support part 20, the wafer retaining plates 21, the boat elevator 22, and the like are installed in the transfer chamber 50. The cassette shelf 15, the spare cassette shelf 16, the cassette transfer device 17, and the like are installed in the cassette holding chamber 60. A wall portion 70 is installed between the transfer chamber 50 and the cassette holding chamber 60. Although not shown in FIG. 1 for the sake of simplicity of the drawings, as illustrated in FIG. 2, the wall portion 70 has an opening 71 and a gate 72 capable of opening and closing the opening 71 is installed therein. The opening 71 is installed so as to correspond to one or more cassettes located at a position where the wafer transfer device 19 can transfer the wafers (generally, the closest position from the wafer transfer device 19), and the height of the upper end and lower end thereof may be substantially equal to that of the upper end and the lower end of the boat 25 which is moved down. For example, for a boat that mounts 150 product wafers, the opening has a height corresponding to a three-stage shelf. The gate 72 has a plate and a drive mechanism, and it is opened and closed by, for example, sliding the plate to the left and right or up and bottom while lifting the plate up from the wall portion 70. That is, the plate may be stored at a position that does not interfere with the movement range of the cassette transfer device 17 when it is opened. A plurality of openings may be separately installed to correspond to the respective cassettes, but one gate 72 may be provided to open and close them at a time. The wall portion 70 and the plate of the gate 72 do not need to be able to withstand a pressure difference, but rather may be designed to be thin so as not to interfere with the cassette transfer device 17. The wafer transfer device 19 transfers the wafers 1 from the cassettes 2 in the cassette holding chamber 60 to the boat 25 through the opening 71 in a state (72a) where the gate 72 is opened. In a state in which the gate 72 is closed, the opening 71 is closed so that the transfer chamber 50 and the cassette holding chamber 60 are isolated from each other. Accordingly, the internal atmosphere of the transfer chamber 50 can be set to an atmosphere different from that of the cassette holding chamber 60. The internal atmosphere of the transfer chamber 50 and the internal atmosphere of the cassette holding chamber 60 will be described in detail later.

(1-3) Processing Furnace

Figure 3:
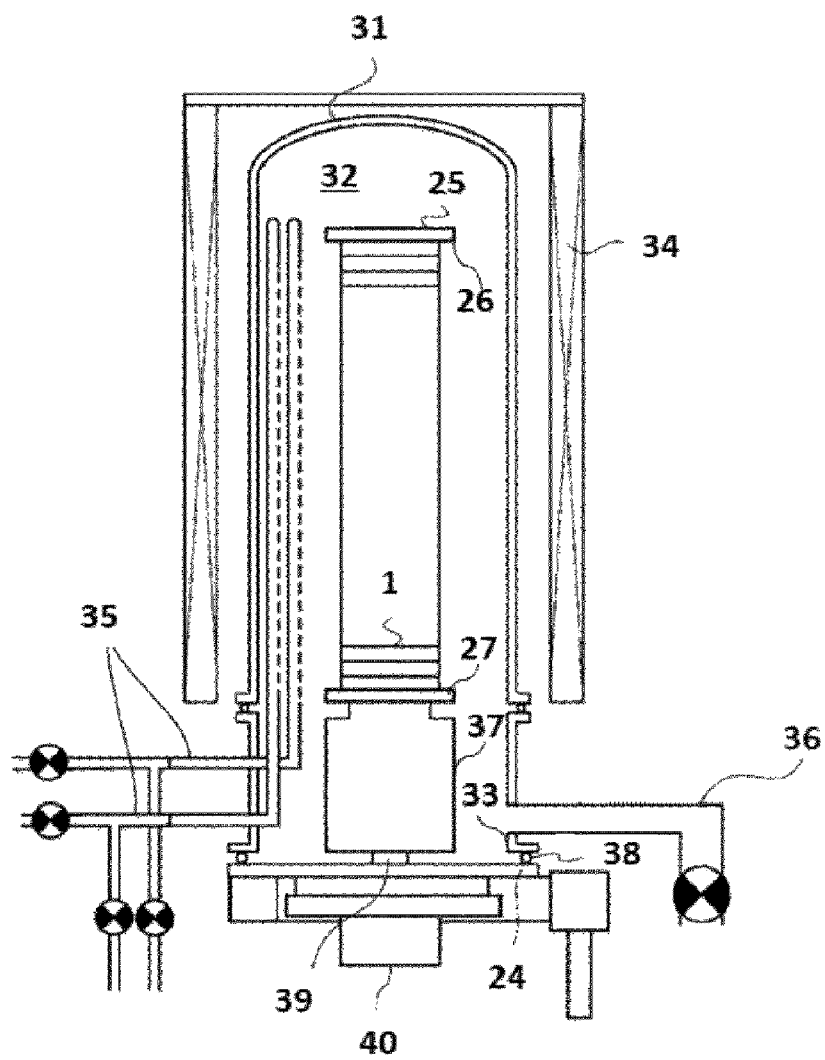
FIG. 3 is a vertical cross sectional view illustrating a reaction tube of the substrate processing apparatus according to an embodiment of the present disclosure.

As illustrated in FIG. 3, the processing apparatus 10 includes a reaction tube (processing tube) 31 which has a cylindrical shape and is made of a material with high heat resistance such as a quartz glass or the like, and whose one end is opened and other end is closed, in which the reaction tube 31 is vertically arranged and fixedly supported so that the center line thereof is vertical. A hollow cylindrical portion of the reaction tube 31 forms a process chamber 32 in which a plurality of wafers 1 are accommodated, and a lower end opening of the reaction tube 31 forms a furnace opening 33 for taking in and out the wafers 1. The furnace opening 33 is open to the transfer chamber 50, and the process chamber 32 and the transfer chamber 50 are connected. A heater 34 for uniformly heating throughout the process chamber 32 is concentrically installed outside the reaction tube 31 so as to surround the periphery of the reaction tube 31, and the heater 34 is supported by the housing 11 of the processing apparatus 10 so as to be vertically installed.

One end of a gas supply pipe 35 for supplying a processing gas is connected to a portion of the side surface of the reaction tube 31 near the furnace opening 33 and the other end of the gas supply pipe 35 is connected to a gas supply source (not shown) for supplying a processing gas. One end of an exhaust pipe 36 is connected to a sidewall of the reaction tube 31 near the furnace opening 33 opposite to the gas supply pipe 35, and the other end of the exhaust pipe 36 is connected to an exhaust device (not shown) such that the process chamber 32 can be exhausted. The seal cap 24 for closing the furnace opening 33 is brought into contact with the lower end surface of the reaction tube 31 with a seal ring 38 inserted therebetween from the lower side in the vertical direction. The seal cap 24 is formed in a disc shape and is configured to be vertically moved up and down by the boat elevator 22 installed outside the reaction tube 31. When the seal cap 24 is moved to the lower end position, a furnace opening shutter 28 (not shown) for sealing the furnace opening 33 may also be installed. A rotary shaft 39 is inserted into and penetrates the center line of the seal cap 24, and the rotary shaft 39 is configured to be raised and lowered together with the seal cap 24 and to be rotated by a rotation driving device 40.

The boat 25 for supporting the wafers 1 as substrates to be processed stands at an upper end of the rotary shaft 39 via a heat insulating cap part 37 so as to be vertically supported. The boat 25 includes a pair of end plates 26 and 27 at its top and bottom, and a plurality of support members (in the present embodiment, three support members) (posts) vertically arranged between the end plates 26 and 27, in which a plurality of holding grooves are arranged in each support member at equal intervals in the longitudinal direction and are recessed so as to be opened to face each other. Furthermore, the outer peripheral edges of the wafers 1 are respectively inserted between the plurality of holding grooves of each support member so that the plurality of wafers 1 are horizontally supported by the boat 25 with the centers of the wafers 1 aligned with one another. The heat insulating cap part 37 is formed on a lower surface of the lower end plate 27 of the boat 25, and a lower end surface of the heat insulating cap part 37 is supported by the rotary shaft 39.

(1-4) Controller

Figure 4:
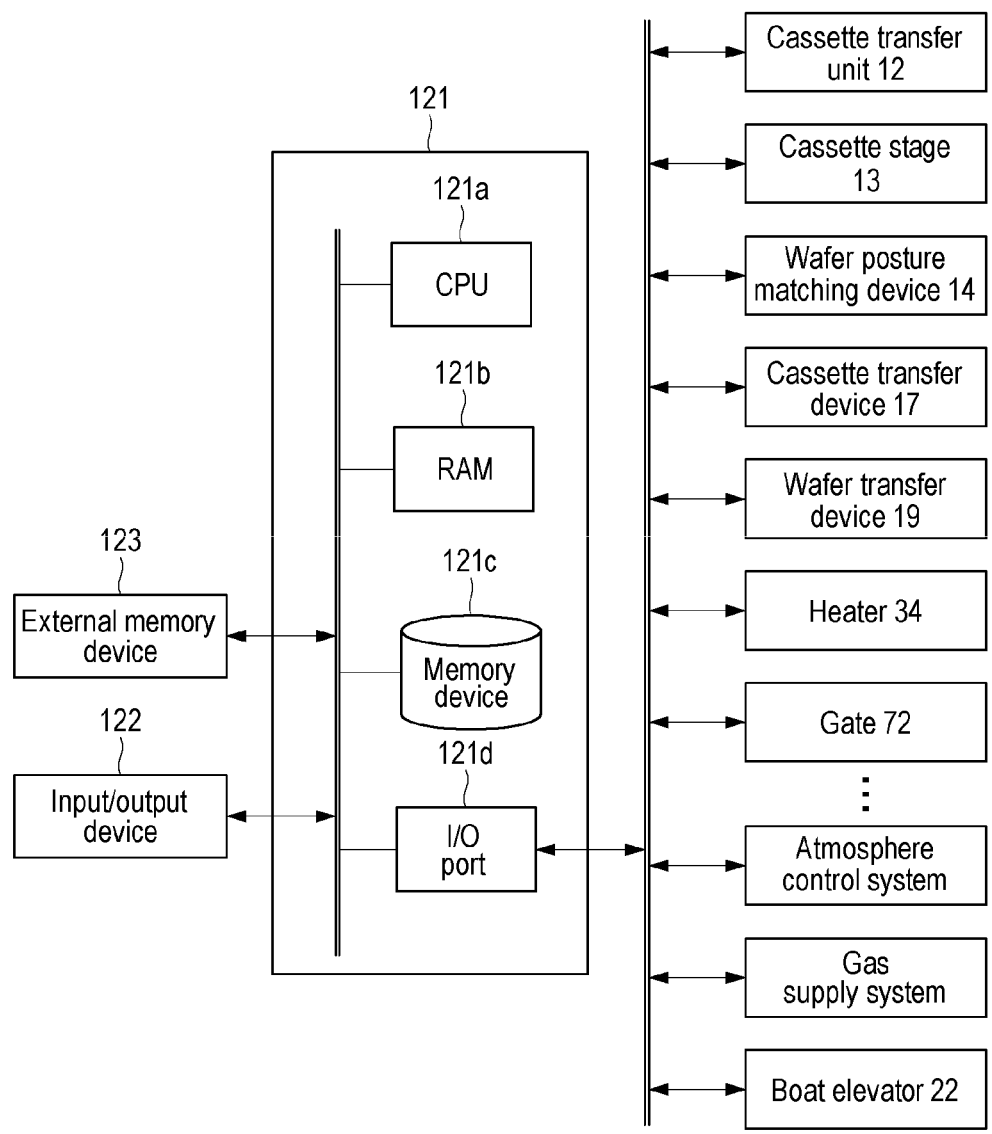
FIG. 4 is a schematic configuration diagram of a controller of the substrate processing apparatus according to an embodiment of the present disclosure, in which a control system of the controller is shown in a block diagram.

FIG. 4 illustrates a block diagram of a controller 121 included in the processing apparatus 10. The controller 121 is configured as a computer including a central processing unit (CPU) 121a, a random access memory (RAM) 121b, a memory device 121c, and an I/O port 121d. The RAM 121b, the memory device 121c and the I/O port 121d are configured to communicate with the CPU 121a via an internal bus. An input/output device 122 formed as, e.g., a touch panel or the like, or an external memory device 123 is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The recipe causes the controller 121 to execute each sequence in the substrate processing, as described hereinbelow, to obtain a predetermined result, and is a high-level language as compared with the control program. Hereinafter, the control program and the recipe will be generally referred to as a "program." The memory device 121c sequentially stores log information in which an operation or a state of the apparatus is recorded. The RAM 121b is configured as a memory area (work area) in which a program or data read by the CPU 121a is temporarily stored.

The I/O port 121d is connected to the cassette transfer unit 12, the cassette stage 13, the wafer posture matching device 14, the cassette transfer device 17, the wafer transfer device 19, the heater 34, a temperature sensor, the rotation mechanism 40, the boat elevator 22, and the like.

The CPU 121a is configured to read the control program from the memory device 121c and execute the same. The CPU 121a also reads the recipe of the substrate from the memory device 121c according to an input of an operation command from the input/output device 122. In addition, the CPU 121a is configured to control, according to the contents of the recipe thus read, the posture matching operation of the cassette transfer unit 12, the rotation operation of the cassette stage 13, the operation of the wafer posture matching device 14 and the robot arm 18 of the cassette transfer device 17, the operation of rotating and moving the wafer transfer device 19 up and down, the temperature of the heater 34, the opening/closing operation of the gate 72, the atmosphere of the transfer chamber 50, the atmosphere of the cassette holding chamber 60, the operation of moving the boat elevator 22 up and down, and the like.

The controller 121 may be configured by installing, on the computer, the aforementioned program or recipe stored in the external memory device 123 (for example, a magnetic disk such as a hard disk, or a semiconductor memory such as a USB memory). The memory device 121c or the external memory device 123 is configured as a computer-readable recording medium.

Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

Next, a method of processing a substrate using the reaction tube 31 of the processing apparatus 10 will be described with reference to FIGS. 5, FIGS. 6A to 6F, and FIGS. 7A to 7D. In the method of processing a substrate described herein, for example, a film forming process of forming a silicon-containing film on a substrate using the reaction tube 31 of the processing apparatus 10 described above, which is one of the processes for manufacturing a semiconductor device, will be described as an example. In the following descriptions, the operations of the respective parts constituting the substrate processing apparatus 10 are controlled by the controller 121.

(Cassette Loading Step (C. CHG): S10)

Figure 6A:
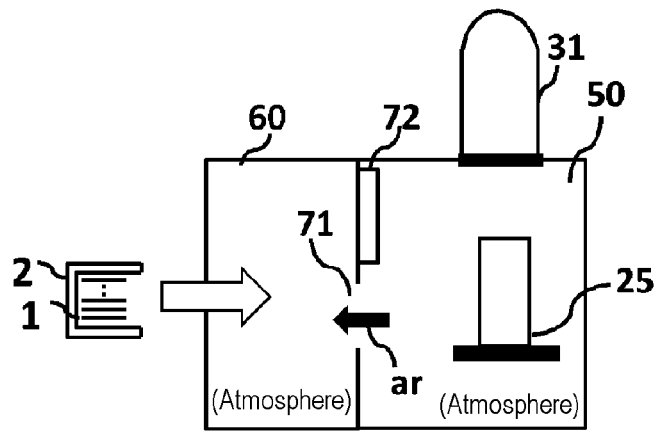
FIGS. 6A to 6F are views illustrating states of the transfer chamber and the cassette holding chamber.

When the cassettes 2 transferred by the external transfer device (not shown) are held in a vertical posture on the cassette stage 13 of the cassette transfer unit (load port transfer) 12, the directions of the wafers 1 in the cassettes 2 are aligned to be in the horizontal posture by the wafer posture matching device 14 and are then loaded into the buffer shelves 15 and 16 by the robot arm 18. The loading into the shelves can proceed asynchronously with the film forming process. Then, the cassettes 2, which are to be batched in the next film forming process, are transferred to a position of the cassette shelf 15 facing the opening 71. At this time, as illustrated in FIG. 6A, the gate 72 is in an open state, and the cassette holding chamber 60 and the transfer chamber 50 are in communication with each other through the opening 71. Then, a clean air, which is a filtered atmosphere, is supplied to the cassette holding chamber 60 and the transfer chamber 50. In principle, at all steps where the gate 72 is in an open state, the transfer chamber 50 has a positive pressure as compared with the cassette holding chamber 60, and the clean air slowly flows from the transfer chamber 50 toward the cassette holding chamber 60 via the opening 71 as indicated by an arrow ar. The gate 72 may be in a closed state at step S10.

(Wafer Charging Step (W. CHG: S20)

Figure 6B:
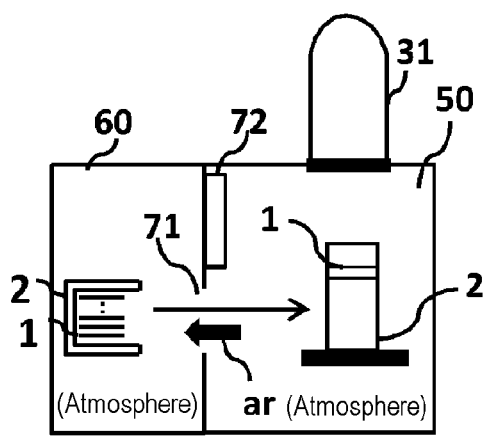

As illustrated in FIG. 6B, the wafer transfer device 19 within the transfer chamber 50 transfers a plurality of wafers 1 in the cassette 2 in the cassette shelf 15 via the opening 71 to the boat 25 at a time or one by one. In the meantime, the clean air filled in the transfer chamber 50 flows out from the opening 71 toward the cassette holding chamber (60. In the state illustrated in FIG. 6B, since the furnace opening shutter 28 is closed and the temperature around the wafers 1 (the boat 25 and the like) is not high, an unnecessary oxide film (a thick natural oxide film or a thermal oxide film) is not formed on the wafers 1. That is, a thin natural oxide film may be originally formed on the wafers handled by an open cassette, but the progress of oxidation at this step may be neglected. In silicon wafers, it is known that natural oxidation is hardly formed on a surface whose hydrogen is terminated by hydrofluoric acid treatment even if it is exposed to the atmosphere at a room temperature.

(Boat Loading Step (BLOAD): S30)

Figure 6C:
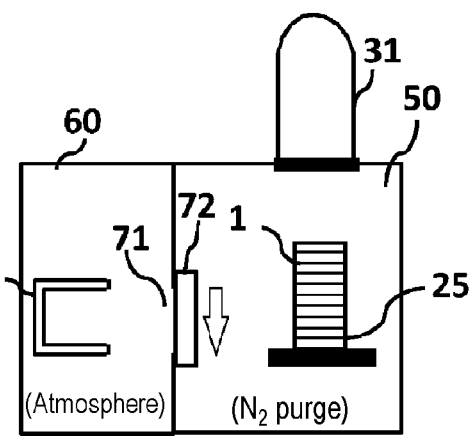
Figure 6D:
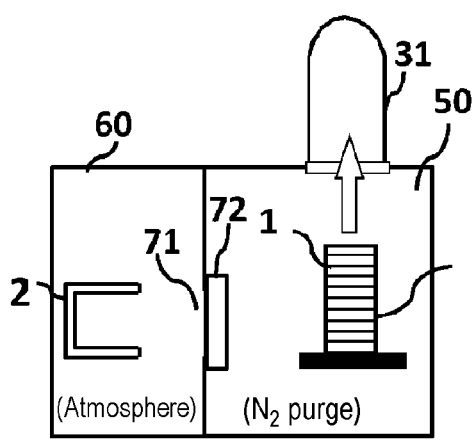

When the transfer of the plurality of wafers 1 to the boat 25 is completed, as illustrated in FIG. 6C, the opening 71 is closed by the gate 72 so that the transfer chamber 50 is substantially sealed. Then, the transfer chamber 50 is purged with a nitrogen gas ($N_2$ gas) from an inert gas supplier (not shown). That is, a nitrogen gas is fed into the space of the transfer chamber 50, and the atmosphere filled in the space of the transfer chamber 50 is substituted with a nitrogen gas. The interior of the reaction tube 31 is similarly filled with substantially a nitrogen gas of an atmospheric pressure before the furnace opening shutter 28 is opened. After the transfer chamber 50 is purged with a nitrogen gas until the oxygen concentration becomes less than a predetermined level, the furnace opening shutter 28 is opened and the boat 25 on which the plurality of wafers 1 are stacked is loaded into the reaction tube 31 by the boat elevator 22 (see FIG. 6D).

(Film Forming Step (DEPO): S40)

Figure 6E:
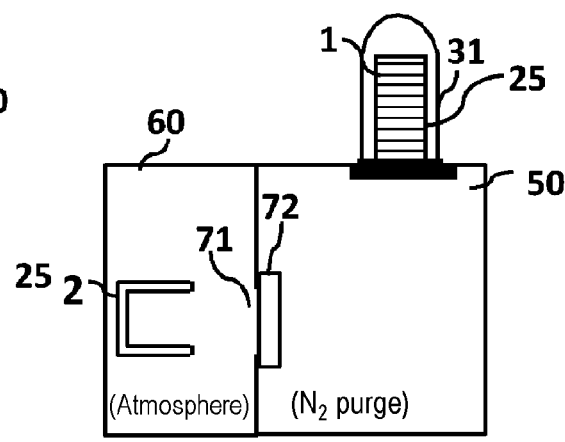

Next, as illustrated in FIG. 6E, when the loading of the boat 25 into the reaction tube 31 is completed, the internal atmosphere of the reaction chamber 32 is controlled such that the interior of the reaction chamber 32 has a predetermined pressure. Furthermore, the interior of the reaction chamber 32 is controlled by the heater 34 such that the interior of the reaction chamber 32 becomes a predetermined temperature (for example, lower than 800 degrees C.), and a single crystal or polycrystalline silicon film is formed on the wafers 1 by supplying a precursor gas (disilane) from the gas supply pipe 35 into the reaction chamber 32. Alternatively, a thin film such as a silicon nitride layer (SiN layer) or the like is formed by supplying a reaction gas (ammonia ($NH_3$) gas) and a precursor gas (hexachlorodisilane ($Si_2Cl_6$) gas). At this time, the unreacted precursor gas, the reaction gas, or the like within the reaction chamber 32 is exhausted from the exhaust pipe 36. During the film formation, the positive pressure is maintained by supplying a predetermined amount of nitrogen gas to the transfer chamber 50. Since the interior of the reaction chamber 32 is lower than 800 degrees C., it cannot be expected to remove the natural oxide film by evaporation.

(Boat Unloading Step (BUNLOAD): S50)

Figure 6F:
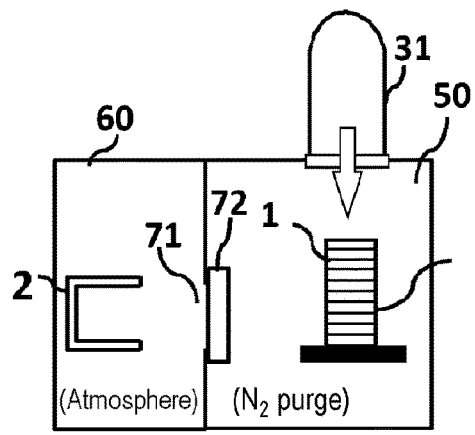

After the thin film having a desired film thickness is formed on the wafers 1, as illustrated in FIG. 6F, the boat 25 is unloaded from the reaction tube 31 by the boat elevator 22. At this time, since the transfer chamber 50 is purged with a nitrogen gas ($N_2$ gas), no oxide film is formed on the wafers 1. It waits for cooling the wafers for a while even after the unloading. At the end of step S50, the atmosphere return is performed by discharging the nitrogen gas within the transfer chamber 50 and introducing air. In addition, since the oxide film after the film formation can be removed by etching or the like as necessary, it is not serious as compared with the oxide film formed on the underlayer of the wafers immediately before the film formation. Therefore, the atmosphere return can start at a temperature higher than a room temperature.

(Wafer Discharging Step (WDCG): S60)

Figure 7A:
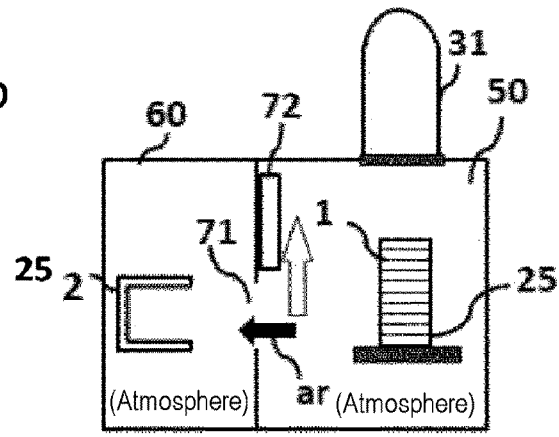
FIGS. 7A to 7D are views illustrating states of the transfer chamber and the cassette holding chamber.

After the temperature of the wafers 1 drops to a temperature at which the wafers 1 can be transferred and the internal atmosphere of the transfer chamber 50 becomes substantially the same composition as that of air, as illustrated in FIG. 7A, the transfer chamber 50 comes into an air atmosphere and the gate 72 is opened to expose the opening 71 between the transfer chamber 50 and the cassette holding chamber 60.

Figure 7B:
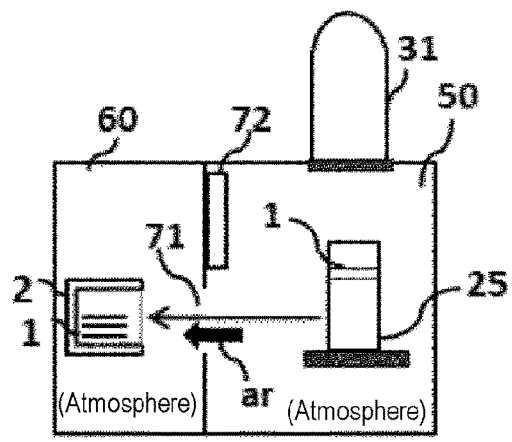

Thereafter, as illustrated in FIG. 7B, the wafer transfer device 19 installed in the transfer chamber 50 transfers the plurality of wafers 1 stacked on the boat 25 to the cassette 2 of the cassette holding chamber 60 via the opening 71.

(Cassette Unloading Step (CDCG): S70)

Figure 7C:
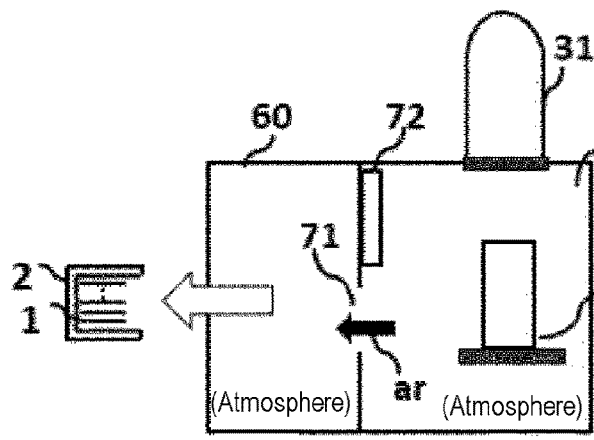

Thereafter, as illustrated in FIG. 7C, the cassette 2 storing the plurality of processed wafers 1 is held on the cassette stage 13 of the cassette transfer unit 12 by the cassette transfer device 17, and is unloaded from the cassette holding chamber 60 by the external transfer device (not shown).

(Idle State (IDOL))

Figure 7D:
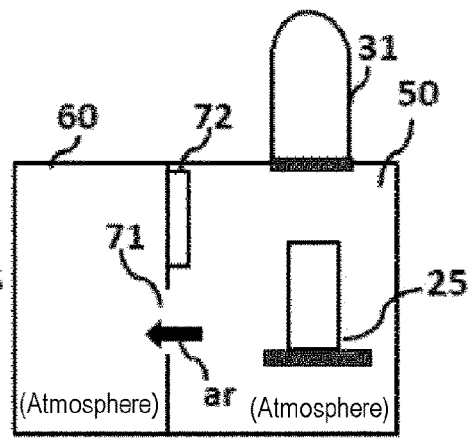

FIG. 7D illustrates an idle state or a standby state of the substrate processing apparatus 10. The gate 72 is in an open state, and the cassette holding chamber 60 and the transfer chamber 50 are connected to each other via the opening 71.

(Flow Rate of Nitrogen Gas to the Transfer Chamber 50)

Figure 8:
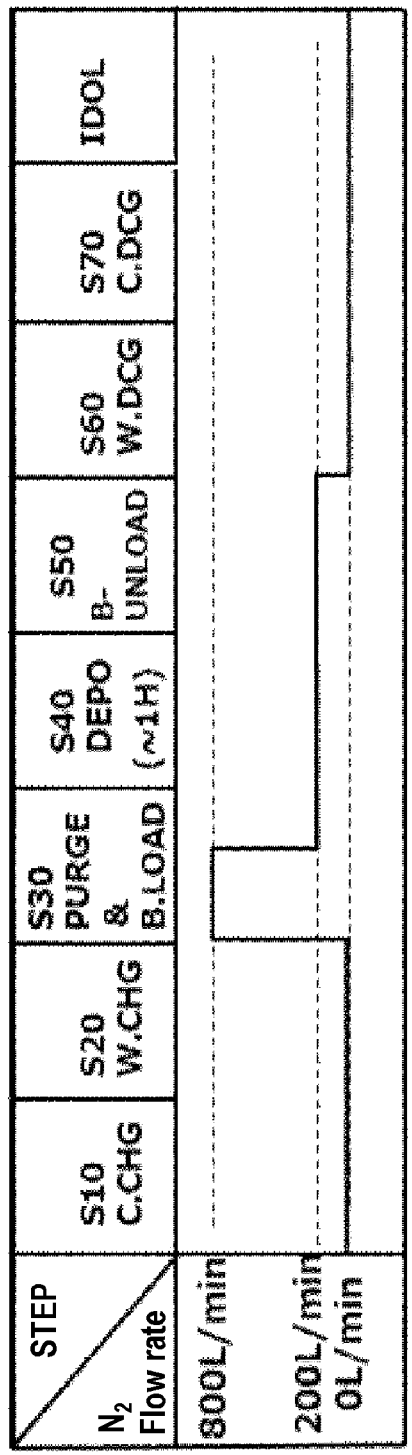
FIG. 8 is a diagram illustrating a flow rate of a nitrogen gas to the transfer chamber.

FIG. 8 is a diagram illustrating a state of a flow rate of a nitrogen gas to the transfer chamber 50 at steps S10 to S70 and in an idle state IDOL. In FIG. 8, the horizontal axis indicates a state of each step and an idle state IDOL, and the vertical axis indicates a flow rate of a nitrogen gas. The flow rate of the nitrogen gas to the transfer chamber 50 is controlled by the controller 121 as atmosphere control of the transfer chamber 50. The atmosphere control of the transfer chamber 50 is the opening/closing control of a nitrogen gas supply valve (not shown), the flow rate control of a nitrogen gas mass flow controller (not shown), or the like.

At steps S10 (CCHG) and S20 (WCHG), the transfer chamber 50 is in an air atmosphere and the flow rate of the nitrogen gas is 0 (zero) L/min (liter/minute). The consumption of the nitrogen gas is 0 (zero).

At step S30 (BLOAD), since the gate 72 is closed and the transfer chamber 50 is changed from the air atmosphere to a nitrogen gas atmosphere, the flow rate of the nitrogen gas is set to about 800 L/min (liter/minute) for, for example, a transfer chamber with a volume of 400 L so that the transfer chamber 50 is rapidly purged with a nitrogen gas. Thereafter, the flow rate of the nitrogen gas changes to, for example, about 200 L/min. In a state in which the transfer chamber 50 is purged with the nitrogen gas, the boat 25 is loaded into the reaction tube 31.

At step S40 (film forming step), the transfer chamber 50 is kept in a state purged with the nitrogen gas for a processing time period of, for example, about 1 hour. Although the flow rate of the nitrogen gas may be a fixed value, it may be variably controlled so as to keep an oxygen concentration at 20 ppm or lower based on measurement by an oxygen concentration meter within the transfer chamber 50. In the case of performing film formation for a longer time, the purge may be stopped, and furthermore, the state may be returned to the atmosphere once and may be set to the same state as that of step S10. In that case, it is necessary to resume the purging at a large flow rate (800 L/min) so that the nitrogen atmosphere having a desired oxygen concentration is reached before the start of step S50.

At step S50 (BUNLOAD), the flow rate of the nitrogen gas to the transfer chamber 50 is set to about 200 L/min. In this state, the boat 25 is unloaded from the reaction tube 31 to the transfer chamber 50 by the boat elevator 22. When the temperature at which the formation of the natural oxide film can be ignored is reached, the flow rate of the nitrogen gas is set to 0, the nitrogen gas within the transfer chamber 50 is discharged and substituted by an atmosphere.

At steps S60 and S70 and in the idle state IDOL, the gate 72 is in an open state, the transfer chamber 50 is in an air atmosphere, and the flow rate of the nitrogen gas to the transfer chamber 50 is 0 L/min. The consumption of the nitrogen gas is 0 (zero).

(Configuration for Air Atmosphere Control of the Cassette Holding Chamber 60 and the Transfer Chamber 50)

Figure 9:
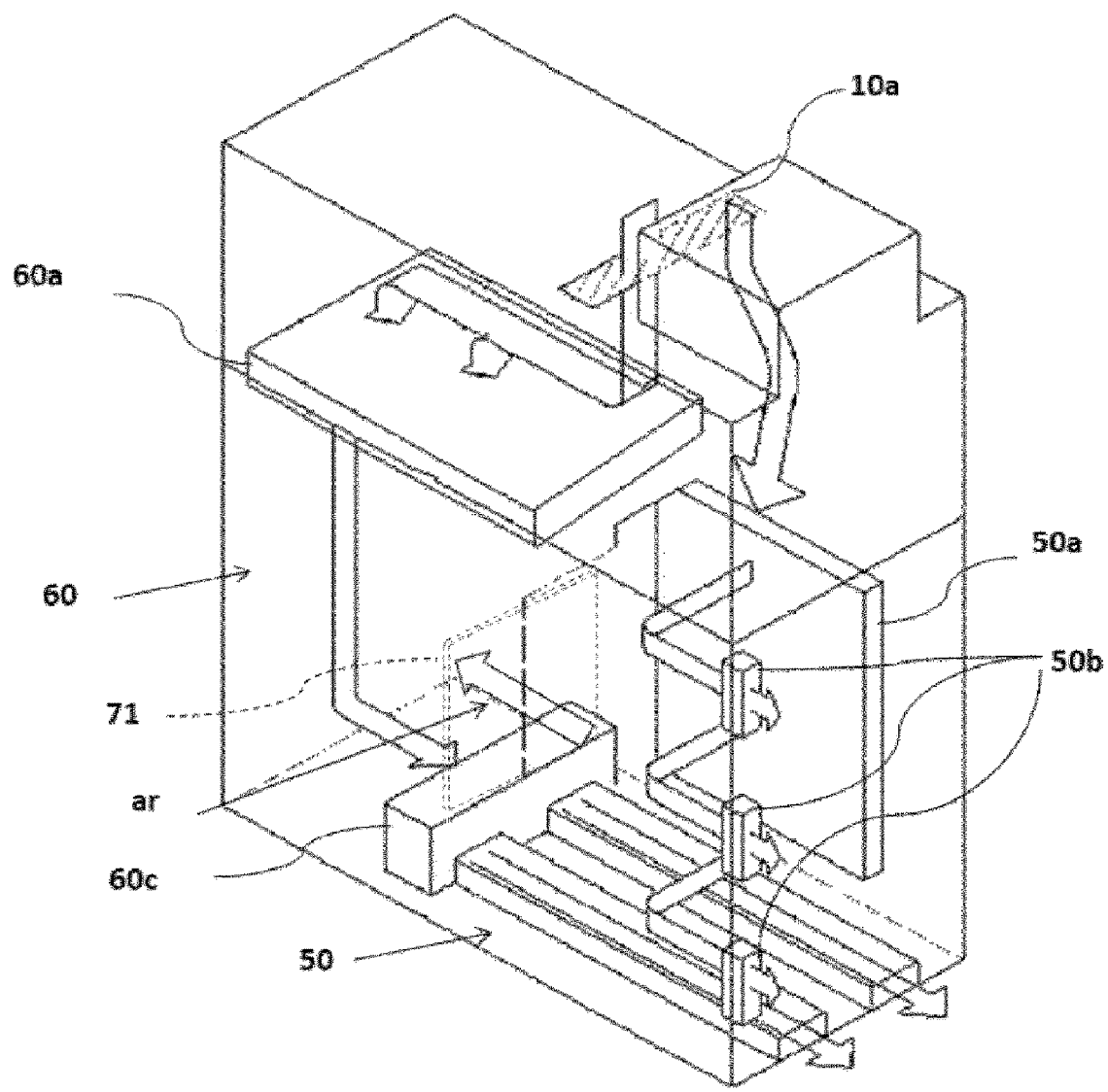
FIG. 9 is a conceptual view illustrating an air atmosphere of the substrate processing apparatus according to an embodiment of the present disclosure.

FIG. 9 illustrates a flow of an air atmosphere in the processing apparatus 10 according to an embodiment of the present disclosure.

The processing apparatus 10 has an air intake hole 10*a* for introducing an atmosphere from its surroundings, for example, from a clean room. The atmosphere introduced from the air suction hole 10*a* flows to the transfer chamber 50 side and the cassette holding chamber 60 side.

The atmosphere flowing to the transfer chamber 50 side is supplied to the clean unit 50*a* installed in the transfer chamber 50, is cleaned by the clean unit 50*a*, and is supplied to the transfer chamber 50. The atmosphere supplied to the transfer chamber 50 is discharged by three rear exhaust fans 50*b* installed in the transfer chamber 50.

The atmosphere flowing to the cassette holding chamber 60 side is supplied to the clean unit 60*a*, is cleaned therein, and is then supplied to the cassette stage 13 and the buffer shelves (15 and 16). The clean unit 60*a* is installed substantially on the entire ceiling surface of the cassette holding chamber 60. The atmosphere supplied from the clean unit 60*a* to the cassette holding chamber 60 is exhausted from an under-shelf exhaust fan 60*c* to the outside on the rear side of the substrate processing apparatus 10 through the underfloor of the transfer chamber 50.

As described above, the opening 71 indicated by a dotted line in FIG. 9 is formed between the transfer chamber 50 and the cassette holding chamber 60. The balance between the air volumes of the clean units 50*a* and 60*a* or the balance between the air volumes of the rear exhaust fans 50*b* and the under-shelf exhaust fan 60*c* is controlled so that the transfer chamber 50 has a slight positive pressure as compared with the cassette holding chamber 60. Therefore, while the gate 72 is opened, a clean air (atmosphere) flows out from the transfer chamber 50 toward the cassette holding chamber 60 via the opening 71, as indicated by an arrow ar. Furthermore, when the cassette transfer unit 12 has an opening to the outside, the air volume of the under-shelf exhaust fan 60*c* can be suppressed so as not to introduce an outdoor air from the opening of the cassette transfer unit 12.

(Configuration for Atmosphere Control of the Transfer Chamber 50)

Figure 10:
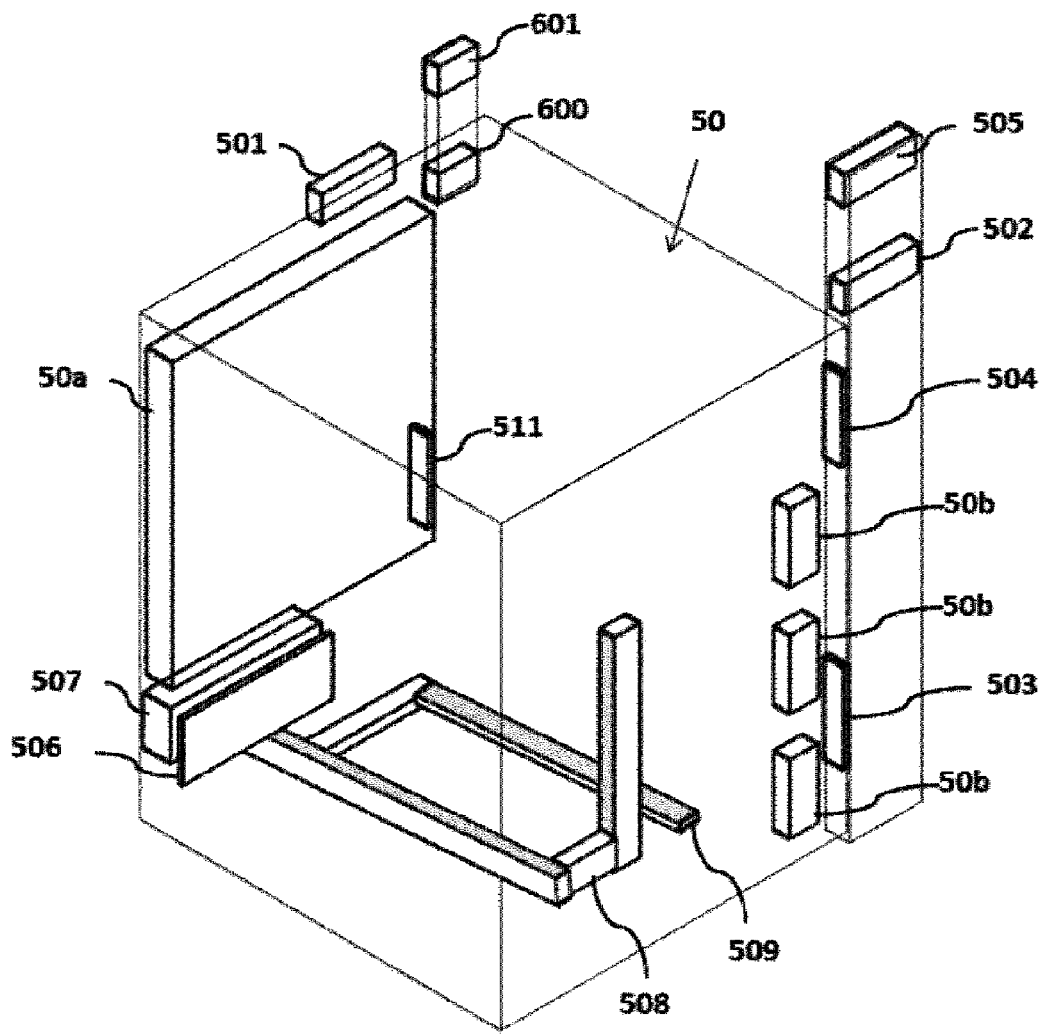
FIG. 10 is a view conceptually illustrating a configuration for atmosphere control in the transfer chamber.

FIG. 10 is a diagram conceptually illustrating a configuration for atmosphere control of the transfer chamber 50. FIG. 11 is a diagram illustrating the atmosphere control of the transfer chamber 50.

The transfer chamber 50 includes a clean unit 50*a*, an air intake 501 for supplying an atmosphere from the air intake hole 10*a* to the clean unit 50*a*, and an inert gas intake hole 600 for supplying a nitrogen gas from an inert gas supplier 601.

The transfer chamber 50 further includes a rear exhaust fan 50*b*, an exhaust damper 502, a rear exhaust damper 503, an exhaust box 504 having a pressure regulation plate, an exhaust duct 505, a circulation damper 506, a radiator 507 as a heat exchanger, a local exhaust duct 508, a circulation duct 509, and a side fan 511 installed on a lateral side of the clean unit 50*a*. The local exhaust duct 508 and the circulation duct 509 are coupled to an intake side of the radiator 507 via the circulation damper 506 and an exhaust side of the radiator 507 is coupled to the clean unit 50*a*. The radiator 507 is used to cool the atmosphere or air of the transfer chamber 50. The local exhaust duct 508 and the circulation duct 509 are installed to exhaust particles caused by operations of, for example, the transfer device 19, the boat elevator 22, the rotation mechanism 40, and the like.

As illustrated in FIG. 11, the transfer chamber 50 has an air atmosphere and a nitrogen gas purge (N$_2$ purge) as a mode.

The air atmosphere has a first mode (CHG/DCHG PROCESS) and a second mode (DOOR OPEN) as operation modes.

The nitrogen gas purge (N$_2$ purge) has a first mode (CHG/DCHG PROCESS), a second mode (Standby, BUNLOAD), and a third mode (atmosphere return) as operation modes.

In the first mode (CHG/DCHG PROCESS) of the air atmosphere, the air intake 501 is open, the exhaust damper 502 is open, the rear exhaust damper 503 is open, the circulation damper 506 is open, the local exhaust duct 508 and the circulation duct 509 are ON (active), the rear fan 50*b* is ON (active), and the side fan 511 is ON (active). This operation mode may be said to be a circulation mode. In the circulation mode, the clean unit 50*a* cools the internal atmosphere of the transfer chamber 50, which is supplied from the circulation damper 506 via the local exhaust duct 508 and the circulation duct 509, by the radiator 507, cleans the cooled atmosphere from the radiator 507 and supplies it to the transfer chamber 50, and discharges a surplus atmosphere to the outside of the apparatus 10. FIG. 12 conceptually illustrates a flow of the atmosphere in the transfer chamber 50 in the circulation mode of the air atmosphere.

Figure 13:
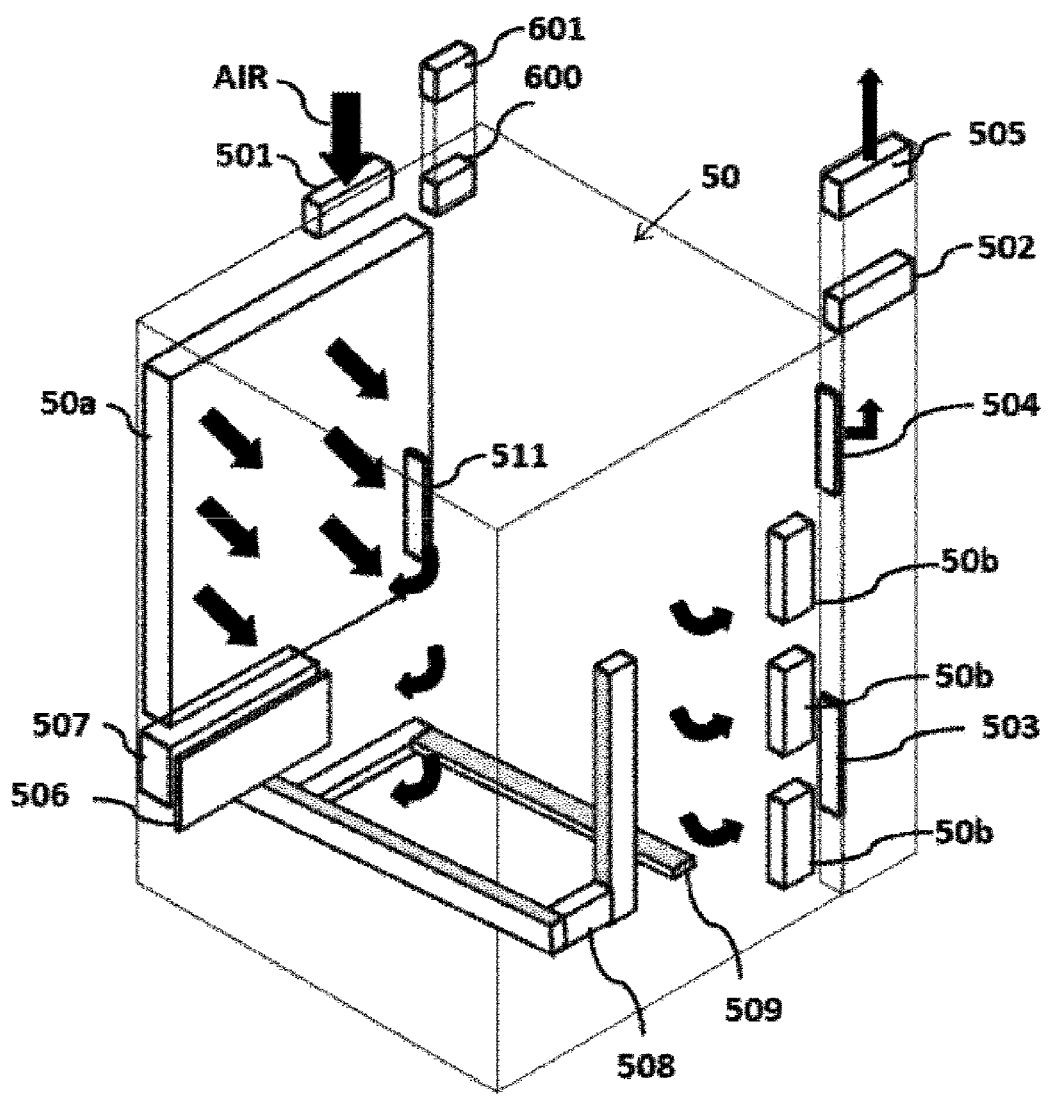
FIG. 13 is a view conceptually illustrating a flow of atmosphere in the transfer chamber in a one-pass mode of an air atmosphere.

In the second mode (DOOR OPEN) of the air atmosphere, the air intake 501 is open, the exhaust damper 502 is open, the rear exhaust damper 503 is open, the circulation damper 506 is closed, the local exhaust duct 508 and the circulation duct 509 are OFF (inactive), the rear fan 50*b* is OFF (inactive), and the side fan 511 is ON (active with MAX). This operation mode may be said to be a one-pass mode. In the one-pass mode, the clean unit 50*a* cleans the atmosphere (air) introduced from the outside of the apparatus 10 and supplies it to the transfer chamber 50, and discharges a surplus air to the outside of the apparatus 10. FIG. 13 illustrates a flow of the atmosphere in the transfer chamber 50 in the one-pass mode of the air atmosphere.

Figure 14:
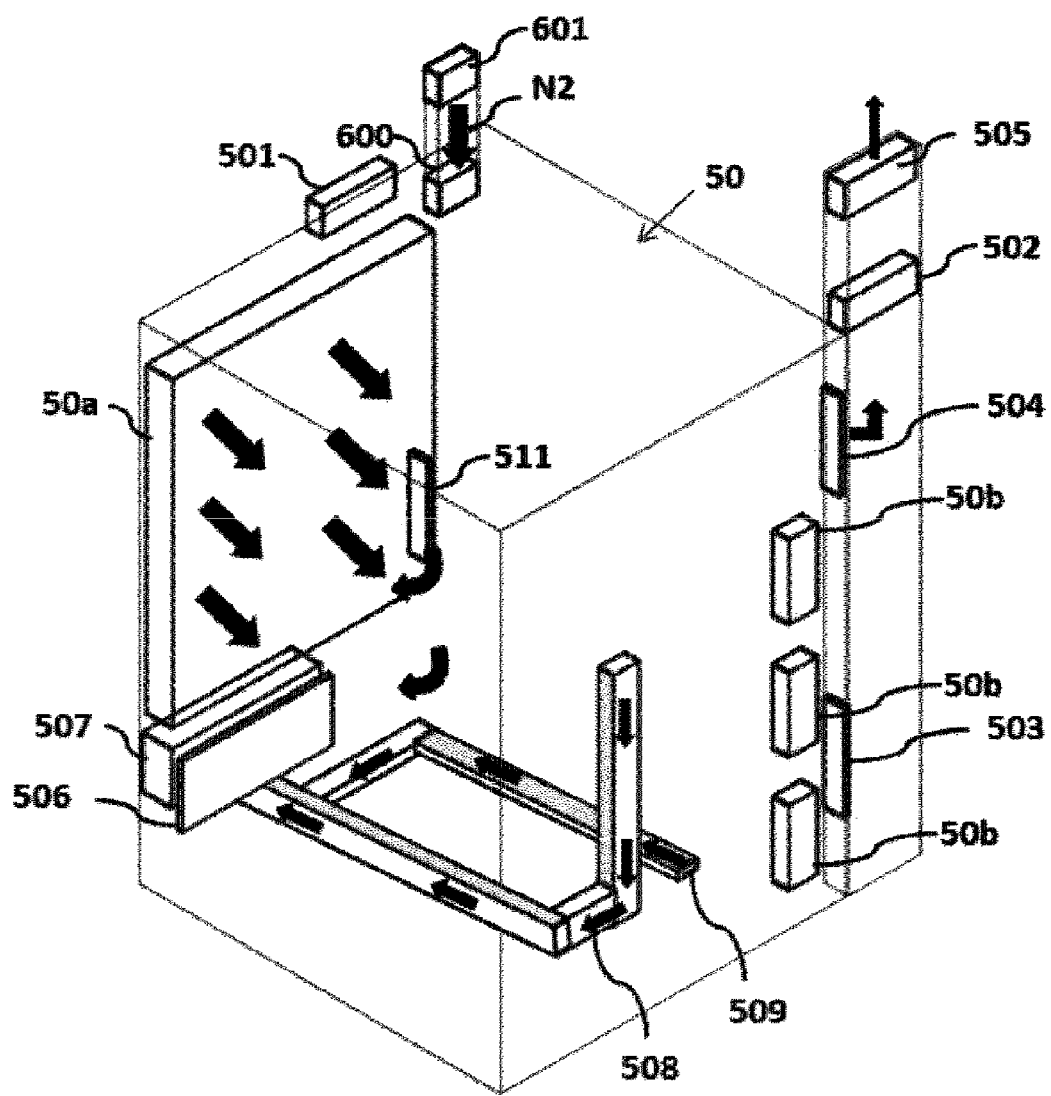
FIG. 14 is a view conceptually illustrating a flow of a nitrogen gas in the transfer chamber in a circulation mode of an $N_2$ purge.

In the first mode (CHG/DCHG PROCESS) of the N₂ purge, the air intake 501 is closed, the exhaust damper 502 is closed, the rear exhaust damper 503 is closed, the circulation damper 506 is open, the local exhaust duct 508 and the circulation duct 509 are ON (active), the rear fan 50b is OFF (inactive), and the side fan 511 is ON (active). This operation mode may be said to be a circulation mode. In the circulation mode, the clean unit 50a cools a nitrogen gas in the transfer chamber 50, which is supplied from the circulation damper 506 via the local exhaust duct 508 and the circulation duct 509, by the radiator 507, cleans the nitrogen gas from the radiator 507 and supplies it to the transfer chamber 50, and discharges a surplus nitrogen gas to the outside of the apparatus 10. FIG. 14 conceptually illustrates a flow of a nitrogen gas in the transfer chamber 50 in the circulation mode of the N₂ purge.

In the second mode (Standby, BUNLOAD) of the N₂ purge, the air intake 501 is open, the exhaust damper 502 is open, the rear exhaust damper 503 is closed, the circulation damper 506 is closed, the local exhaust duct 508 and the circulation duct 509 are OFF (inactive), the rear fan 50b is OFF (inactive), and the side fan 511 is ON (active). This operation mode may be said to be a one-pass mode.

Figure 15:
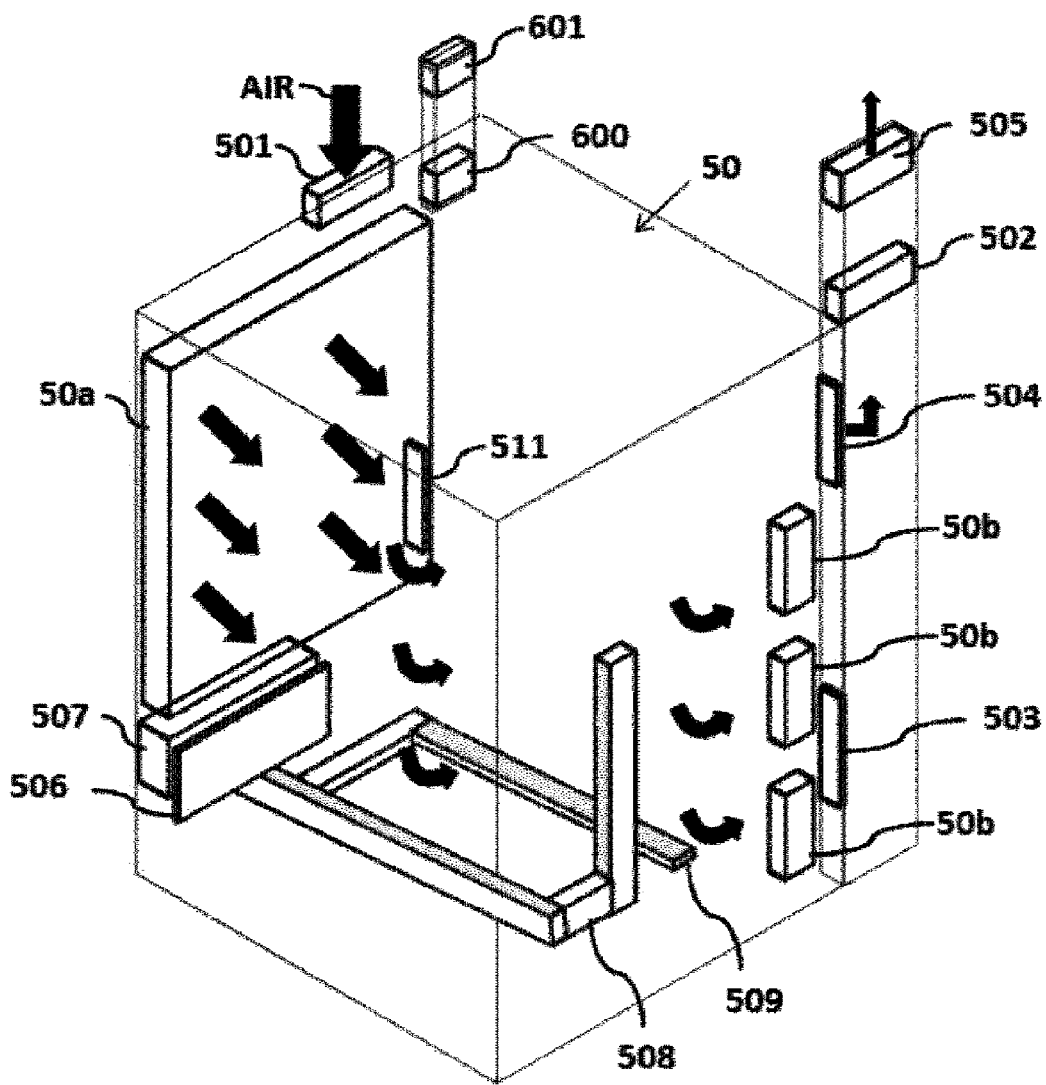
FIG. 15 is a view conceptually illustrating a flow of a gas when returning from an $N_2$ atmosphere to an air atmosphere.

In the third mode (atmosphere return) of the N₂ purge, as illustrated in FIG. 15, the air intake 501 is open, the exhaust damper 502 is open, the rear exhaust damper 503 is closed, the circulation damper 506 is open, the local exhaust duct 508 and the circulation duct 509 are ON (active), the rear fan 50b is OFF (inactive), and the side fan 511 is ON (active).

(3) Effects According to the Present Embodiment

According to the present embodiment, one or more effects as set forth below may be achieved.

1) The wall portion 70 is installed between the transfer chamber 50 and the cassette holding chamber 60. The wall portion 70 has the opening 71, and the gate 72 capable of opening and closing the opening 71 is installed. When the opening 71 is closed by the gate 72, the transfer chamber 50 and the cassette holding chamber 60 are isolated. Thus, it is possible to purge the interior of the transfer chamber 50 with a nitrogen gas. The purging with the nitrogen gas in the transfer chamber 50 is performed only during a period when the gate is closed. Accordingly, it is possible to reduce the consumption of the nitrogen gas.

2) The purging of a load lock chamber is unnecessary as compared with a system that purges the transfer chamber all the time by including a plurality of load lock chambers, and thus, the cassette loading step S10 and the wafer charging step S20 can be carried out in a short time. Accordingly, since the time of one batch substrate processing can be shortened correspondingly, it is possible to improve the productivity of substrate processing.

3) In a state in which the gate 72 is opened and the opening 71 is opened, the transfer chamber 50 and the cassette holding chamber 60 are connected via the opening 71. In this state, the transfer chamber 50 and the cassette holding chamber 60 come into an air atmosphere. Thus, it is possible to reduce the consumption of the nitrogen gas, and to prevent an organic gas from being accumulated in the transfer chamber 50.

4) In the above 2), since the transfer chamber 50 has a positive pressure as compared with the cassette holding chamber 60, the clean atmosphere flows from the transfer chamber 50 to the cassette holding chamber 60 side. This makes it possible to keep the atmosphere of the transfer chamber 50 clean.

5) The air atmosphere of the transfer chamber 50 can be switched between the one-pass mode and the circulation mode. This, it is possible to clean the interior of the transfer chamber 50.

6) The nitrogen gas atmosphere of the transfer chamber 50 can be switched between the one-pass mode and the circulation mode. Thus, it is possible to clean the interior of the transfer chamber 50 and to suppress the consumption of the nitrogen gas.

According to the present disclosure in some embodiments, it is possible to reduce consumption of an inert gas such as a nitrogen gas for purging a transfer chamber.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a reaction chamber configured to process a substrate on a substrate support that is loaded into the reaction chamber;
a transfer chamber connected to the reaction chamber and in which the substrate support unloaded from the reaction chamber is disposed;
a gate configured to open and close at least one opening and installed in the transfer chamber to move the substrate inside and outside the transfer chamber;
a buffer shelf installed outside the transfer chamber to face the at least one opening and to support a substrate container;
a transfer device configured to transfer the substrate between the substrate container of the buffer shelf and the substrate support;
a clean unit configured to supply a clean atmosphere to the transfer chamber;
an inert gas supplier configured to supply an inert gas to the transfer chamber; and
a controller configured to control the inert gas supplier such that, after the loading of the substrate from the substrate container to the substrate support by the transfer device is completed and the gate is closed, the inert gas supplier supplies the inert gas during at least a portion of a time period until the gate is opened again and does not supply the inert gas outside the portion of the time period so as to unload the processed substrate from the substrate support to the substrate container, and control the clean unit to switch between a first mode and a second mode such that the transfer chamber is kept at a positive pressure by an air atmosphere and air flows out of the transfer chamber while the gate is opened,
wherein, in the first mode, the clean unit intakes and cleans an internal atmosphere of the transfer chamber, and supplies the internal atmosphere thus cleaned to the transfer chamber, and
wherein, in the second mode, the clean unit cleans air introduced from an outside of the apparatus and supplies the air thus cleaned to the transfer chamber, and discharges a surplus air to the outside of the apparatus.

2. The apparatus of claim 1, wherein loading of the substrate support into the reaction chamber and unloading of the substrate support from the reaction chamber are carried out while the transfer chamber is in an atmosphere having a predetermined oxygen concentration or lower.

3. The apparatus of claim 1, wherein the transfer chamber is sequentially switched to an air environment, a nitrogen environment, and the air environment in a film forming process sequence,
wherein, in the air environment, the clean unit supplies the air at a first flow rate where particles derived from the transfer device can be discharged at least while the transfer device operates, and
wherein, in the nitrogen environment, the clean unit circulates the air at a second flow rate where the transfer chamber is kept at the positive pressure.

4. The apparatus of claim 2, wherein the transfer chamber is sequentially switched to an air environment, a nitrogen environment, and the air environment in a film forming process sequence,
wherein, in the air environment, the clean unit supplies the air at a first flow rate where particles derived from the transfer device can be discharged at least while the transfer device operates, and
wherein, in the nitrogen environment, the clean unit circulates the air at a second flow rate where the transfer chamber is kept at the positive pressure.

5. The apparatus of claim 1, wherein the clean unit has a heat exchanger configured to cool the atmosphere or air supplied to the transfer chamber, and
wherein the transfer device is installed in the transfer chamber and transfers the substrate from the substrate container placed outside the transfer chamber to the substrate support while the gate is opened.

6. The apparatus of claim 2, wherein the clean unit has a heat exchanger configured to cool the atmosphere or air supplied to the transfer chamber, and
wherein the transfer device is installed in the transfer chamber and transfers the substrate from the substrate container placed outside the transfer chamber to the substrate support while the gate is opened.

7. The apparatus of claim 3, wherein the clean unit has a heat exchanger configured to cool the atmosphere or air supplied to the transfer chamber, and
wherein the transfer device is installed in the transfer chamber and transfers the substrate from the substrate container placed outside the transfer chamber to the substrate support while the gate is opened.

8. The apparatus of claim 4, wherein the clean unit has a heat exchanger configured to cool the atmosphere or air supplied to the transfer chamber, and
wherein the transfer device is installed in the transfer chamber and transfers the substrate from the substrate container placed outside the transfer chamber to the substrate support while the gate is opened.

9. The apparatus of claim 1, wherein the at least one opening includes a plurality of openings,
wherein the plurality of openings are formed at a position closest to the transfer device on a wall of the transfer chamber and arranged in a vertical direction, and
wherein the gate is configured to open and close the plurality of openings at a time.

10. The apparatus of claim 2, wherein the at least one opening includes a plurality of openings,
wherein the plurality of openings are formed at a position closest to the transfer device on a wall of the transfer chamber so as to be arranged in a vertical direction, and
wherein the gate is configured to open and close the plurality of openings at a time.

11. The apparatus of claim 3, wherein the at least one opening includes a plurality of openings,
wherein the plurality of openings are formed at a position closest to the transfer device on a wall of the transfer chamber so as to be arranged in a vertical direction, and
wherein the gate is configured to open and close the plurality of openings at a time.

12. The apparatus of claim 4, wherein the at least one opening includes a plurality of openings,
wherein the plurality of openings are formed at a position closest to the transfer device on a wall of the transfer chamber so as to be arranged in a vertical direction, and
wherein the gate is configured to open and close the plurality of openings at a time.

13. The apparatus of claim 1, further comprising:
a holding chamber installed in contact with the transfer chamber via the at least one opening and configured to accommodate the buffer shelf; and
a transfer unit installed in contact with the holding chamber and configured to transfer the substrate container to and from the outside of the substrate processing apparatus,
wherein the substrate container is an open cassette, and the transfer unit is opened to the outside.

14. The apparatus of claim 2, further comprising:
a holding chamber installed in contact with the transfer chamber via the at least one opening and configured to accommodate the buffer shelf; and
a transfer unit installed in contact with the holding chamber and configured to transfer the substrate container to and from the outside of the substrate processing apparatus,
wherein the substrate container is an open cassette, and the transfer unit is opened to the outside.

15. The apparatus of claim 3, further comprising:
a holding chamber installed in contact with the transfer chamber via the at least one opening and configured to accommodate the buffer shelf; and
a transfer unit installed in contact with the holding chamber and configured to transfer the substrate container to and from the outside of the substrate processing apparatus,
wherein the substrate container is an open cassette, and the transfer unit is opened to the outside.

16. The apparatus of claim 4, further comprising:
a holding chamber installed in contact with the transfer chamber via the at least one opening and configured to accommodate the buffer shelf; and
a transfer unit installed in contact with the holding chamber and configured to transfer the substrate container to and from the outside of the substrate processing apparatus,
wherein the substrate container is an open cassette, and the transfer unit is opened to the outside.

17. A method of manufacturing a semiconductor device, comprising:
charging a plurality of substrates stored in a substrate container of a buffer shelf on a substrate support within a transfer chamber via an opening;
closing the opening with a gate and loading the substrate support on which the plurality of substrates are stacked into a reaction tube installed in the transfer chamber;
forming a film on the plurality of substrates;
unloading the substrate support on which the plurality of substrates are stacked from the reaction tube; and opening the gate and unloading the plurality of substrates stacked on the substrate support from the transfer chamber to the substrate container of the buffer shelf via the opening, wherein, in the act of loading the substrate support, the act of forming the film, and the act of unloading the substrate support, a clean unit that supplies a clean atmosphere to the transfer chamber is operated in a first mode in which an internal atmosphere of the transfer chamber is intaken, cleaned and supplied to the transfer chamber, wherein, in the act of charging the plurality of substrates and the act of unloading the plurality of substrates, the clean unit is operated in a second mode in which air introduced from an outside is cleaned and supplied to the transfer chamber and a surplus air is discharged to an outside of an apparatus, wherein, in the first mode, an inert gas is supplied from an inert gas supplier to the transfer chamber, and wherein, in the second mode, while the gate is opened, the transfer chamber is kept at a positive pressure by an air atmosphere and air flows out of the transfer chamber.

18. A non-transitory computer-readable recording medium storing a program that causes a substrate processing apparatus to perform a process by a computer, the process comprising:

charging a plurality of substrates stored in a substrate container of a buffer shelf on a substrate support within a transfer chamber via an opening;

closing the opening with a gate and loading the substrate support on which the plurality of substrates are stacked into a reaction tube installed in the transfer chamber;

forming a film on the plurality of substrates;

unloading the substrate support on which the plurality of substrates are stacked from the reaction tube; and opening the gate and unloading the plurality of substrates stacked on the substrate support from the transfer chamber to the substrate container of the buffer shelf via the opening, wherein the process further comprises:

in the act of loading the substrate support, the act of forming the film, and the act of unloading the substrate support, causing an inert gas supplier to supply an inert gas to the transfer chamber;

outside the act of loading the substrate support, the act of forming the film, and the act of unloading the substrate support, causing the inert gas supplier to stop supplying the inert gas; and controlling a clean unit that supplies a clean atmosphere to the transfer chamber to switch between a first mode and a second mode such that the transfer chamber is kept at a positive pressure by an air atmosphere and air flows out of the transfer chamber while the gate is opened, wherein, in the first mode, the clean unit intakes and cleans an internal atmosphere of the transfer chamber, and supplies the internal atmosphere thus cleaned to the transfer chamber, and wherein, in the second mode, air introduced from outside is cleaned and supplied to the transfer chamber and a surplus air is discharged out of the apparatus.

* * * * *